United States Patent
Hird et al.

(10) Patent No.: US 6,801,863 B1
(45) Date of Patent: Oct. 5, 2004

(54) METHOD FOR DETECTING THE CONNECTIVITY OF ELECTRICAL CONDUCTORS DURING AUTOMATED TEST USING LONGITUDINAL BALANCE MEASUREMENTS

(75) Inventors: Stephen Hird, Fort Collins, CO (US);
John E Siefers, Loveland, CO (US);
Kevin G Chandler, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 8 days.

(21) Appl. No.: 10/385,313

(22) Filed: Mar. 10, 2003

(51) Int. Cl.⁷ ................................................. G01L 1/00
(52) U.S. Cl. ............................ 702/44; 324/425; 379/22
(58) Field of Search .......................... 702/44; 324/71.1, 324/425, 537, 76.11; 714/736, 734; 379/26.01, 22, 22.03, 22.02, 32.02

(56) References Cited

U.S. PATENT DOCUMENTS

| | | | | |
|---|---|---|---|---|
| 4,176,780 A | * | 12/1979 | Sacher et al. | ............... 714/736 |
| 4,791,359 A | * | 12/1988 | Raymond et al. | ........... 714/734 |
| 4,806,850 A | * | 2/1989 | Saumade et al. | ......... 205/775.5 |
| 5,144,247 A | * | 9/1992 | Speck | ......................... 324/425 |
| 5,469,048 A | * | 11/1995 | Donohue | ..................... 324/71.1 |
| 5,504,432 A | * | 4/1996 | Chandler et al. | ............ 324/537 |
| 5,747,983 A | * | 5/1998 | Lara et al. | .................. 324/71.1 |
| 6,442,239 B1 | | 8/2002 | Abdo et al. | |

* cited by examiner

*Primary Examiner*—John Barlow
*Assistant Examiner*—Hien Vo (57) ABSTRACT

A method and apparatus for detecting a resistive fault in an electrical conductor is presented. The apparatus of the invention includes an oscillating signal generator that applies an oscillating signal to the electrical conductor under test. The apparatus includes a measuring device for measuring the potential between the electrical conductor under test and a reference node. Such measurements are obtained both when the apparatus is disconnected from the electrical conductor under test and when the apparatus is connected to the electrical conductor under test. A difference in the measurements indicates that the connectivity of the electrical conductor is intact, whereas no difference indicates that a resistive fault exists somewhere in the electrical conductor. For greater accuracy, the longitudinal balance of the disconnected apparatus and connected apparatus measurements are calculated to determine connectivity. In an automated test environment, the measuring apparatus is part of the tester hardware and the connections to the electrical conductor under test are made through tester interface pins and fixture probes.

24 Claims, 7 Drawing Sheets

METHOD FOR DETECTING THE CONNECTIVITY OF ELECTRICAL CONDUCTORS DURING AUTOMATED TEST USING LONGITUDINAL BALANCE MEASUREMENTS

FIELD OF THE INVENTION

The present invention relates generally to electrical connectivity testing more particularly to a method and device for detecting the connectivity of wires, cables, printed circuit board traces and connectors of a device under test during automated test using longitudinal balance measurements.

BACKGROUND OF THE INVENTION

It is often required to detect the connectivity of an electrical conductor of an electrical device. For example, in an automated test environment in which a run of devices that are identical by design are being tested, electrical continuity testing is standard procedure. Such an automated test environment may test printed circuit boards (PCBs) after manufacture. Connectivity testing is performed in bare-board testing of a printed circuit board (prior to attachment of components and devices) to test the continuity of the traces between pads on the board. Connectivity testing is performed in loaded-board testing (after attachment of some or all the electrical components and devices) to verify that all required electrical connections between the components and the board have been properly completed.

Existing methods to detect the connectivity of electrical conductors such as wires, cables, PCB traces, and connectors in an automated test environment generally require the use of external sensors (e.g., a capacitive measuring probe such as Agilent Technology's TestJet Probe for the 3070 Automated Tester). External sensors can be ineffective if blocked by a ground plane or if the sensor cannot be physically located near the electrical conductor under test.

An alternative method for detecting the electrical connectivity of electrical conductors in an automated test environment is known as a loopback test. In a loopback test a signal is applied to a pin of the device under test. The signal loops to another pin and is measured using a detector. Loopback testing typically requires the use of custom made loopback cables and requires operator intervention.

Accordingly, a need exists for an alternative method for determining the electrical connectivity of electrical conductors in an automated test environment that does not involve external sensors, loopback cables, or operator intervention.

SUMMARY OF THE INVENTION

The present invention is a novel method and apparatus for detecting the connectivity of electrical conductors. In an automated test environment, the connectivity of electrical conductors can be determined without the use of external sensors, loopback cables, or operator intervention.

In accordance with a preferred embodiment of the invention, the measurement apparatus includes a pair of identical valued resistors connected in series between a measurement node and a reference node. A signal generator applies an oscillating signal to an intermediate node between the two series-connected resistors. A measuring device measures the potential between the measurement node and reference node.

In accordance with one embodiment of the invention, a connectivity detection function obtains the following measurements from the meter: the potential $E_{disconnected}$ when the measurement apparatus is disconnected from the electrical conductor under test, and the potential $E_{connected}$ when the measurement apparatus is connected to the electrical conductor under test. The connectivity detection function calculates the difference between the potentials $E_{disconnected}$ and $E_{connected}$, and determines that electrical connectivity of the electrical conductor under test exists if the potentials $E_{disconnected}$ and $E_{connected}$ are substantially unequal (i.e., outside of a margin of error relative one another). For greater accuracy, the longitudinal balance of the potentials is instead calculated and compared.

In accordance with a second embodiment, a connectivity detection function obtains the following measurements from the meter the potential $E_{KGEC\_disconnected}$ when the measurement apparatus is disconnected from the known good electrical conductor, $E_{KGEC\_connected}$ when the measurement apparatus is connected to the known good electrical conductor, the potential $E_{ECUT\_disconnected}$ when the measurement apparatus is disconnected from the electrical conductor under test, and $E_{ECUT\_connected}$ when the measurement apparatus is connected to the electrical conductor under test. The connectivity detection function calculates the difference between the potentials $E_{KGEC\_disconnected}$ and $E_{KGEC\_connected}$, and the difference between the potentials $E_{ECUT\_disconnected}$ and $E_{ECUT\_connected}$. The calculated differences are then compared. Electrical connectivity of the electrical conductor under test exists if the differences $E_{KGEC\_disconnected} - E_{KGEC\_connected}$ and $E_{ECUT\_disconnected} - E_{ECUT\_connected}$ are substantially equal (i.e., within a margin of error relative one another). For greater accuracy, the longitudinal balance of the potentials and differences are instead calculated and compared. In addition, if the differences $E_{KGEC\_disconnected} - E_{KGEC\_connected}$ and $E_{ECUT\_disconnected} - E_{ECUT\_connected}$ are substantially unequal (i.e., outside of a margin of error relative one another), the values of the measurements may be used to calculate the approximate location of the resistive fault.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
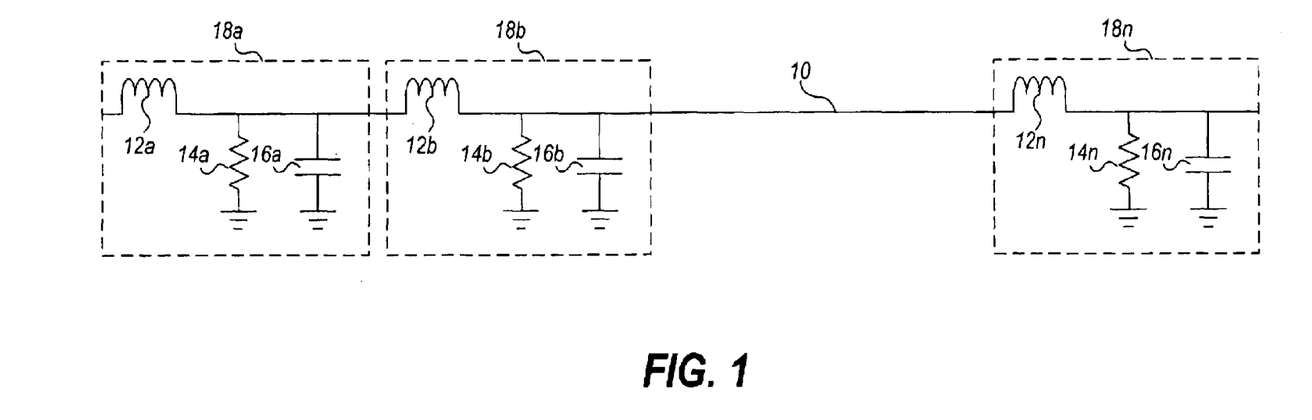
FIG. 1 is a schematic model diagram of an electrical conductor.

Turning now to the drawings, FIG. 1 illustrates the circuit model of an electrical conductor 10. The electrical conductor 10 may be in the form of a cable (e.g., a coaxial cable, or a wire in a twisted pair or parallel cable), a wire, a printed circuit board trace, an integrated circuit trace, or a connector. Regardless of its form, every electrical conductor 10 is characterized by intrinsic distributed resistance, capacitance, and inductance. For an electrical conductor of consistent continuous cross-sectional area, the distributed inductance $12a$, $12b$, $12n$, resistance $14a$, $14b$, $14n$, and capacitance $16a$, $16b$, $16n$ remains equal for each unit segment $18a$, $18b$, $18n$ of the conductor. This property gives rise to the electrical law that the inductance, resistance, and capacitance of an electrical conductor of constant cross-sectional area is proportional to the length of the electrical conductor. In addition, it follows that two electrical conductors of identical composition, identical continuous cross-sectional area, and identical length have identical electrical characteristics.

Figure 2:
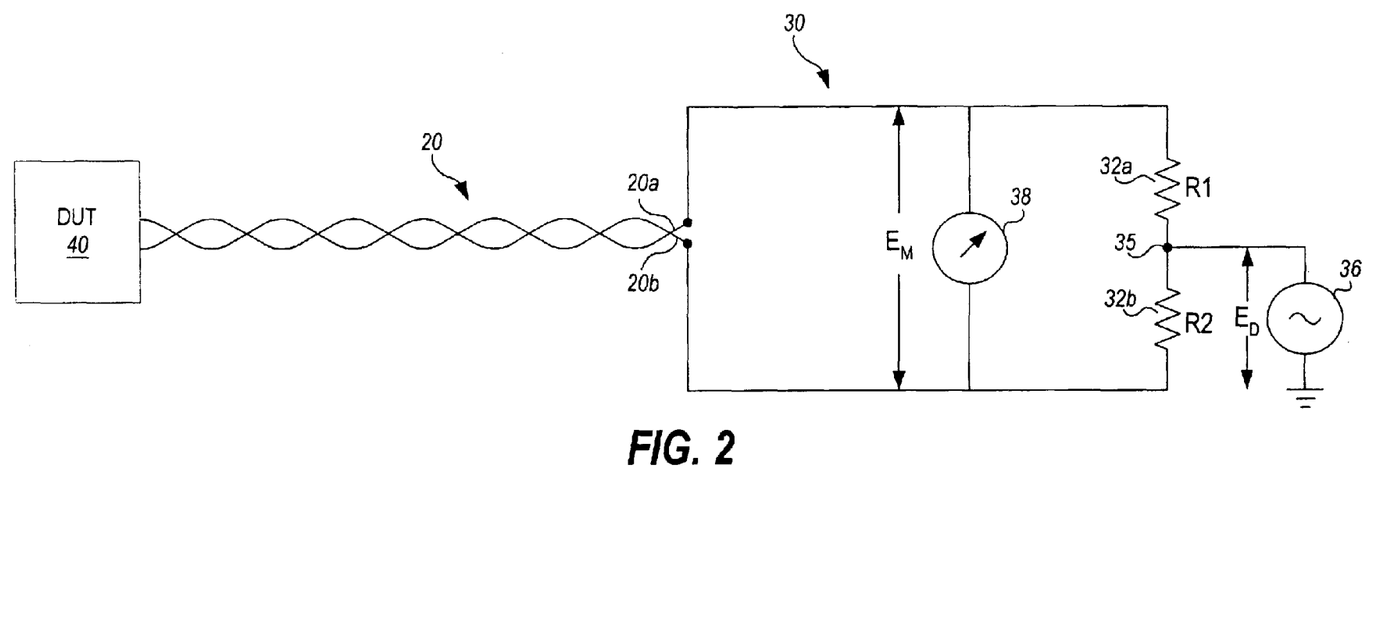
FIG. 2 is a schematic diagram of a longitudinal balance testing apparatus on a twisted pair cable.

These laws, used in conjunction with a longitudinal balance test, may be applied to test the continuity of two theoretically identical electrical conductors. FIG. 2 illustrates the application of a longitudinal balance test apparatus 30 to a twisted pair cable 20 attached to a device under test 40 to test the connectivity of the cable 20. A longitudinal balance test compares the resistive properties of one wire $20a$ to the other wire $20b$ in the wire pair 20. In theory, the two wires $20a$ and $20b$ should have the same electrical characteristics because they are generally equal lengths of wire of theoretically identical cross-sectional area having the same metallic composition.

Longitudinal balance relates to the difference in voltage between the two wires $20a$, $20b$ of a pair 20 (i.e., the responsive "metallic voltage") that arises in response to a voltage (i.e., the disturbing "longitudinal voltage") that might arise between the wires and a communication node such as ground. The Institute of Electrical and Electronics Engineers (IEEE) has published a standard for measuring longitudinal balance. It defines the degree of longitudinal balance as the ratio of the disturbing longitudinal voltage $E_D$ and the resulting metallic voltage $E_M$ of the network under test expressed in decibels, namely:

Longitudinal Balance=$20*\log_{10}(E_D/E_M)$ dB, (Equation 1.1)

where the voltages $E_D$ and $E_M$ are of the same frequency.

In the present invention, the longitudinal balance test apparatus 30 artificially generates the disturbing longitudinal voltage $E_D$. The resulting metallic voltage $E_M$ may then be measured and used to calculate the longitudinal balance of the wire pair 20 using Equation 1.1 above.

Turning in detail to the test setup of FIG. 2, the cable under test 20 comprises a first wire $20a$ and a second wire $20b$, each serially connected to a respective resistor $32a$, $32b$. A wave generator 36 is connected between a node 35 (located between resistors $32a$ and $32b$) and ground. The wave generator 36 applies an alternating current signal (i.e., the disturbing voltage $E_d$) to node 35, and therefore to each of the first wire $20a$ and second wire $20b$. A measuring device 38 such as a voltmeter measures the potential between the first wire $20a$ and second wire $20b$. If the two wires are identical and unbroken (i.e., without any resistive faults), the potential across the two lines should be zero.

In practice, the first wire $20a$ and second wire $20b$ may not be precisely electrically identical due to manufacturing process variations. If not, a slight potential may exist between the first wire $20a$ and second wire $20b$ even though each line is unbroken. Accordingly, threshold limits should be determined to distinguish between a non-zero potential due to wire manufacturing variations and a non-zero potential due to an open connection in one of the wires.

Figure 3A:
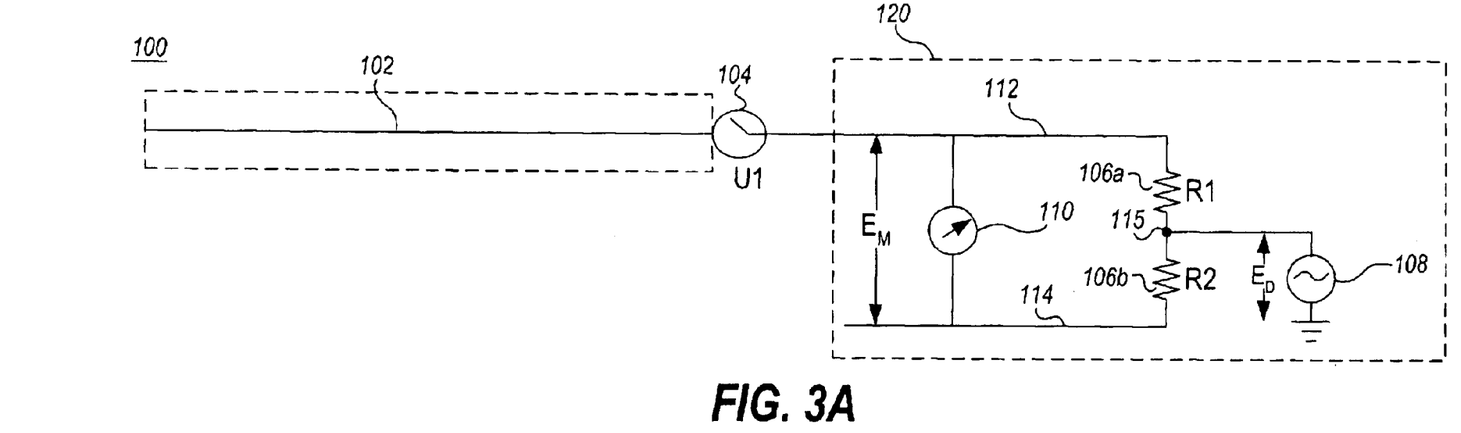
FIG. 3A is a schematic diagram of a connectivity detection apparatus implemented in accordance with the invention for detecting the connectivity of an electrical conductor under test.

FIG. 3A is a schematic diagram of a first embodiment of a system 100 which employs a connectivity detection apparatus 120 implemented in accordance with the invention. As shown, the system 100 includes a relay U1 104 having an input connected to a node 112 of the apparatus 120 and an output electrically couplable to an electrical conductor 102 (such as a wire, cable, PCB trace, or connector) of a device under test (DUT) 140. A pair of identical valued resistors R1 $106a$ and R2 $106b$ are connected in series between the apparatus node 112 at the input of the relay U1 104 and a reference node 114. A wave generator 108 is connected at node 115 (between resistors R1 $106a$ and R2 $106b$) and referenced to ground. The wave generator 108 applies an alternating current signal on node 115. A measuring device 110 such as a voltmeter is connected between the apparatus nodes 112 and 114.

Figure 4:
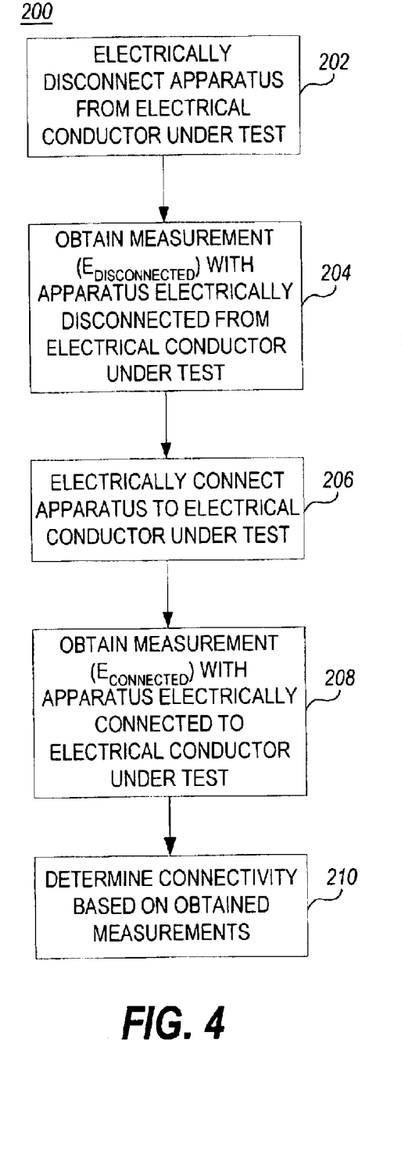
FIG. 4 is an operational flowchart of a first embodiment of a method for detecting connectivity of an electrical conductor under test in accordance with the invention.

FIG. 4 illustrates a first embodiment of a method of operation 200 of the connectivity detection apparatus 120 of FIG. 3A. To begin, in step 202 the relay U1 104 is opened in order to intentionally electrically disconnect the apparatus 120 from the electrical conductor under test 102. A measurement $E_{disconnected}$ from the meter 110 is obtained in step 204 with the apparatus 120 electrically disconnected from the electrical conductor under test 102. In step 206, the relay U1 104 is then closed in order to electrically connect the apparatus 120 to the electrical conductor under test 102. A measurement $E_{connected}$ from the meter 110 is obtained in step 208 with the apparatus 120 electrically connected to the electrical conductor under test 102. In step 210, the connectivity of the electrical conductor under test 102 is determined.

Figure 5A:
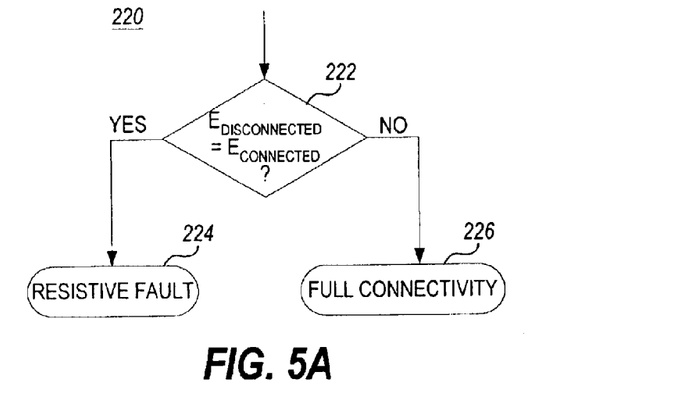
FIG. 5A is a first embodiment of a method for determining the connectivity of an electrical conductor under test based on measurements collected from the connectivity detection apparatus as described in FIG. 4.

One method of connectivity determination is illustrated at 220 in FIG. 5A and involves a step 222 in which a comparison is made between the measurement $E_{connected}$ obtained when the apparatus 120 was connected to the electrical conductor under test 102 and the measurement $E_{disconnected}$ obtained when the apparatus 120 was disconnected from the electrical conductor under test 102. If the measurements are substantially equal (subject to error thresholds), this indicates in step 224 that a resistive fault (i.e., a broken or missing conductor under test) exists in the electrical conductor under test 102. However, if the measurements are not equal (outside of error margin thresholds) and within the test limits, this indicates in step 226 full connectivity (i.e., the electrical conductor under test 102 is present and unbroken).

Figure 5B:
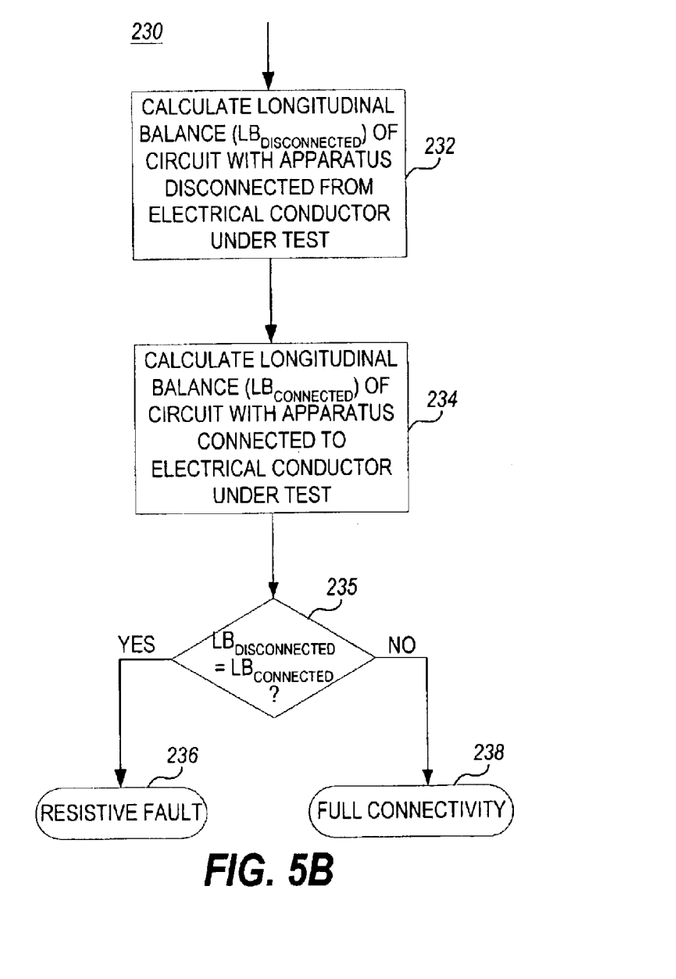
FIG. 5B is a second embodiment of a method for determining the connectivity of an electrical conductor under test based on measurements collected from the connectivity detection apparatus as described in FIG. 4.

For greater accuracy, the longitudinal balance of the electrical conductor under test 102 may be calculated and used to determine connectivity, as illustrated in FIG. 5B. Accordingly to this method 230, the longitudinal balance $LB_{disconnected}$ of the circuit when the apparatus 130 is disconnected from the electrical conductor under test is calculated in step 232 according to Equation 1.1. The longitudinal balance $LB_{connected}$ of the circuit when the apparatus 130 is connected to the electrical conductor under test is calculated in step 234 also according to Equation 1.1. The longitudinal balances $LB_{disconnected}$ and $LB_{connected}$ are compared in step 235. If the longitudinal balance $LB_{connected}$ is equal to the longitudinal balance $LB_{connected}$ (within a margin of error), this indicates in step 236 a resistive fault in the electrical conductor under test. If the longitudinal balance $LB_{disconnected}$ is not equal to the longitudinal balance $LB_{connected}$ (outside the margin of error), this indicates in step 238 full connectivity (i.e., the electrical conductor under test 102 is present and unbroken).

Figure 3B:
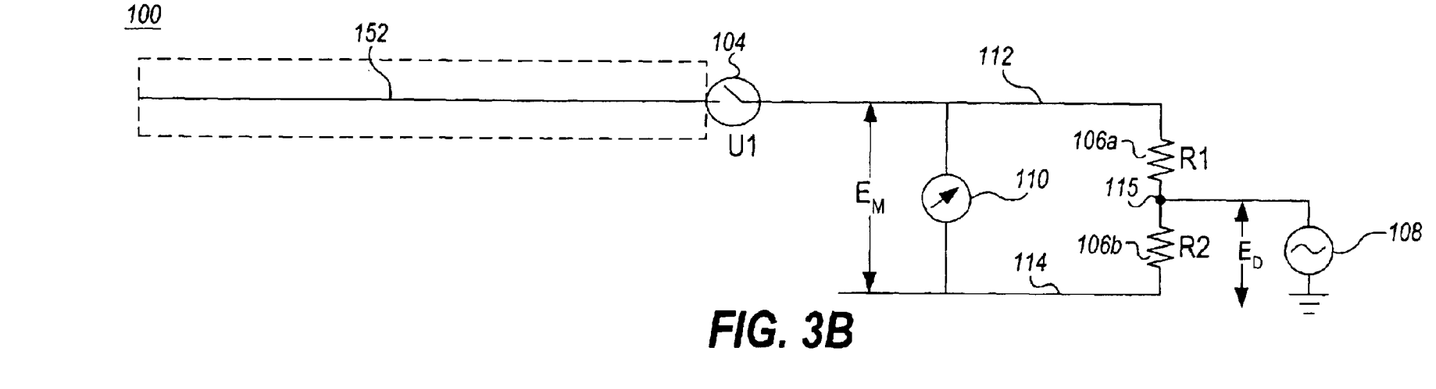
FIG. 3B is a schematic diagram of the connectivity detection apparatus of FIG. 3A connected to detect the connectivity of a known good electrical conductor.
Figure 6:
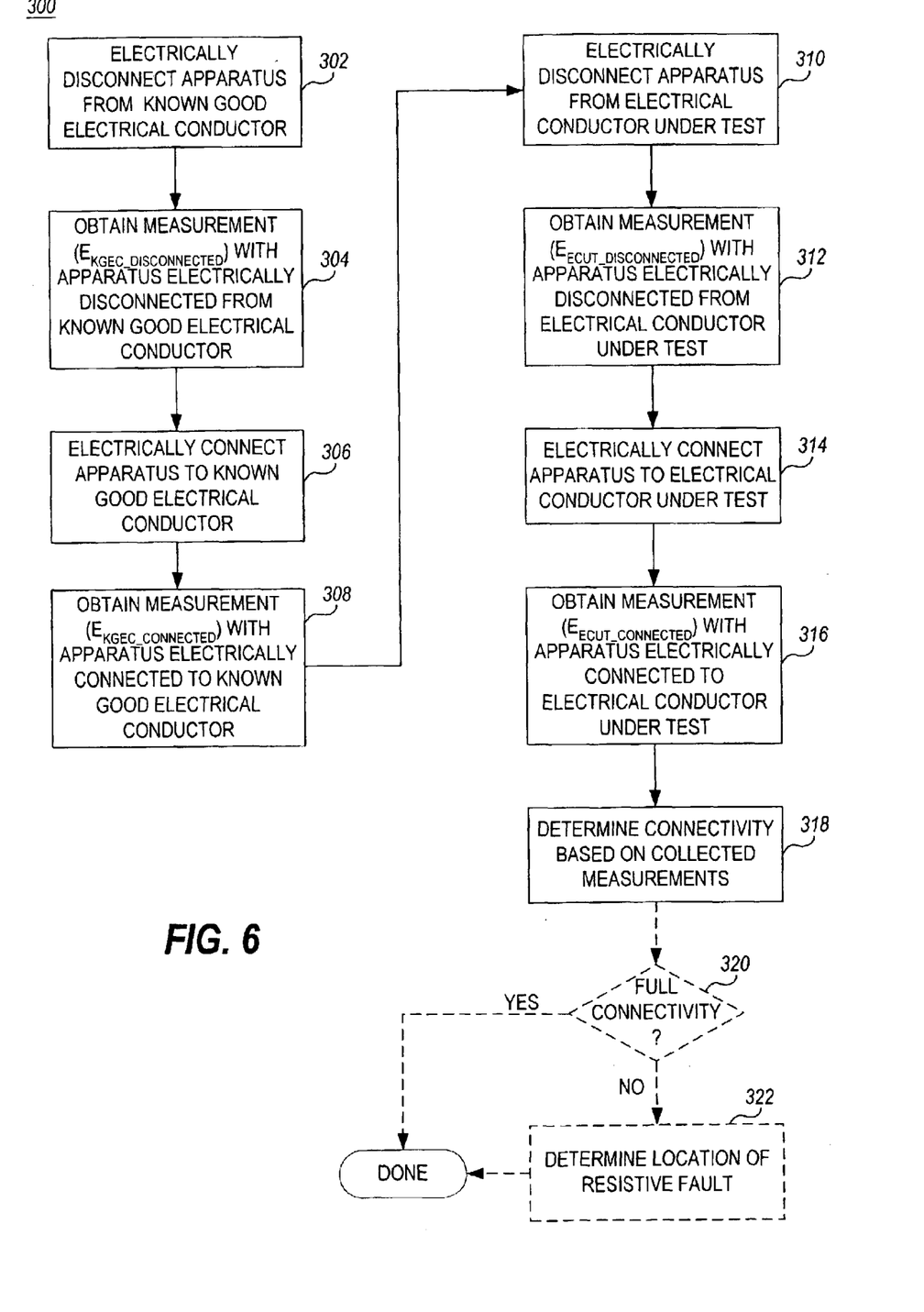
FIG. 6 is an operational flowchart of a second embodiment of a method for detecting connectivity of an electrical conductor under test in accordance with the invention.

FIGS. 3A and 3B illustrate the use of the connectivity detection apparatus 120 in an alternative measuring method described in FIG. 6 in which measurements are obtained by the connectivity detection apparatus 120 from both a known good electrical conductor and the electrical conductor under test, and compared, to determine the connectivity of the electrical conductor under test 102.

More particularly, as described in the method 300 of FIG. 6, and with particular reference to FIG. 3B which shows the apparatus 120 applied to a known good electrical conductor 152 that is identical by design to the electrical conductor under test 102, in step 302 the relay U1 104 is opened in order to intentionally electrically disconnect the apparatus 120 from the known good electrical conductor 152. A measurement $E_{KGEC\_disconnected}$ from the meter 110 is obtained in step 304 with the apparatus 120 electrically disconnected from the known good electrical conductor 152. In step 306, the relay U1 104 is then closed in order to electrically connect the apparatus 120 to the known good electrical conductor 152. A measurement $E_{KGEC\_connected}$ from the meter 110 is obtained in step 308 with the apparatus 120 electrically connected to the electrical conductor under test 102.

The apparatus 120 is then used to take measurements from the electrical conductor under test 102. Accordingly, with particular reference also to FIG. 3A, in step 310, the relay U1 104 is opened in order to intentionally electrically disconnect the apparatus 120 from the electrical conductor under test 102 (and from the known good electrical conductor 152). A measurement $E_{ECUT\_disconnected}$ from the meter 110 is obtained in step 312 with the apparatus 120 electrically disconnected from the electrical conductor under test 102. In step 314, the relay U1 104 is then closed in order to electrically connect the apparatus 120 to the electrical conductor under test 102. A measurement $E_{ECUT\_connected}$ from the meter 110 is obtained in step 316 with the apparatus 120 electrically connected to the electrical conductor under test 102.

In step 318, the connectivity of the electrical conductor under test 102 is determined based on the collected measurements $E_{KGEC\_disconnected}$, $E_{KGEC\_connected}$, $E_{ECUT\_disconnected}$, and $E_{ECUT\_connected}$. Optionally, if it is determined that full connectivity does not exist in step 320, then the location of the fault may be determined in step 322 based on the collected measurements.

Figure 7:
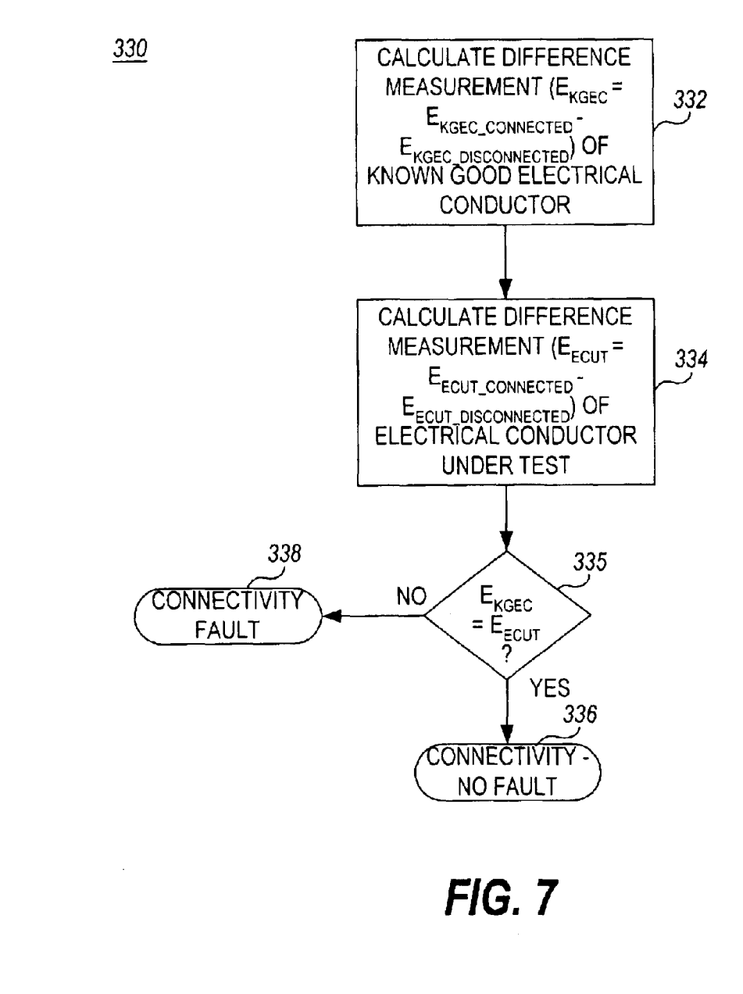
FIG. 7 is an operational flowchart of a method for determining the connectivity of an electrical conductor under test based on measurements collected from the connectivity detection apparatus as described in FIG. 6.

FIG. 7 illustrates a method 330 that may be used to implement step 318 for determining the connectivity of the electrical conductor under test 102. According to method 330, in step 332, the difference $E_{KGEC}$ between the measurements taken when the apparatus 120 was connected to the known good electrical conductor 152 $E_{KGEC\_connected}$ and when the apparatus 120 was disconnected from the known good electrical conductor 152 $E_{KGEC\_disconnected}$ is calculated (i.e., $E_{KGEC}=E_{KGEC\_connected}-E_{KGEC\_disconnected}$). In step 334, the difference $E_{ECUT}$ between the measurements taken when the apparatus 120 was connected to the electrical conductor under test 102 $E_{ECUT\_connected}$ and when the apparatus 120 was disconnected from the electrical conductor under test 102 $E_{ECUT\_disconnected}$ is calculated (i.e., $E_{ECUT}=E_{ECUT\_connected}-E_{ECUT\_disconnected}$).

In step 335, the difference measurement $E_{ECUT}$ calculated for the electrical conductor under test 102 is compared to the difference measurement $E_{KGEC}$ calculated for the known good electrical conductor 152. If the measurements $E_{ECUT}$ and $E_{KGEC}$ are substantially equal (subject to error margin thresholds), this indicates in step 336 that the electrical conductor under test 102 has full connectivity with no resistive faults. However, if the measurements $E_{ECUT}$ and $E_{KGEC}$ are substantially unequal (subject to error margin thresholds), this indicates in step 338 that a resistive fault (i.e., an open or partial open) exists somewhere along the electrical conductor under test 102.

Figure 8:
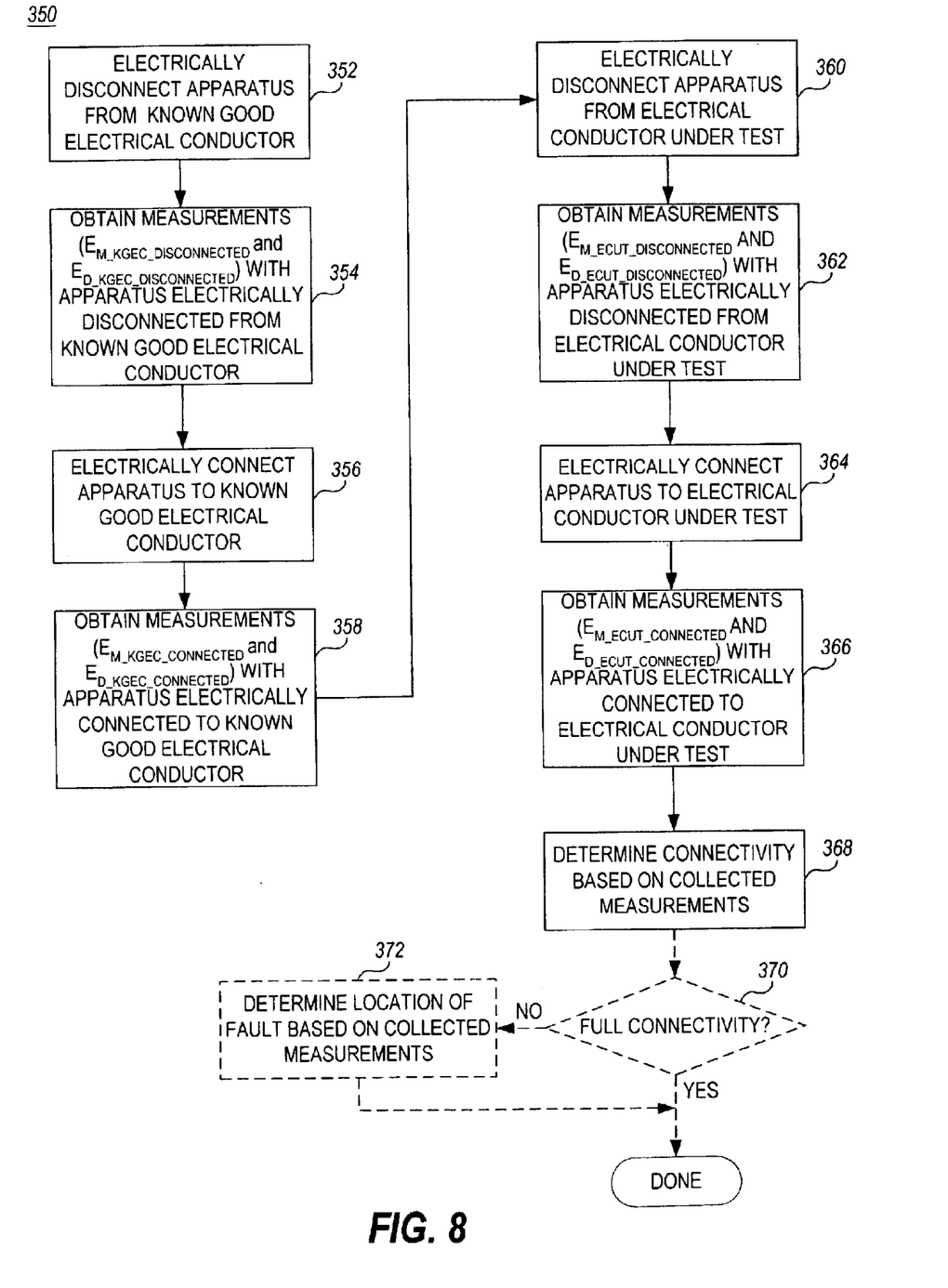
FIG. 8 is an operational flowchart of a third embodiment of a method for detecting connectivity of an electrical conductor under test in accordance with the invention.

FIG. 8 illustrates an alternative measuring method 350 from that shown in FIG. 6. In this method 350, the measurements are also obtained by the connectivity detection apparatus 120 from both a known good electrical conductor and the electrical conductor under test However, for even greater accuracy, the longitudinal balance of each measurement is calculated and used in the comparison to determine the connectivity of the electrical conductor under test.

Turning in detail to the method 350 of FIG. 6, and with particular reference to FIG. 3B which shows the apparatus 120 applied to a known good electrical conductor 152 that is identical by design to the electrical conductor under test 102, in step 352 the relay U1 104 is opened in order to intentionally electrically disconnect the apparatus 120 from the known good electrical conductor 152. The metallic voltage measurement $E_{m\_KGEC\_disconnected}$ taken across the measuring device 110 between nodes 112 and 114 of the apparatus 120 and the disturbing voltage measurement $E_{d\_KGEC\_disconnected}$ taken across the wave generator 108 between node 115 and ground are obtained in step 354 with the apparatus 120 electrically disconnected from the known good electrical conductor 152. In step 356, the relay U1 104 is then closed in order to electrically connect the apparatus 120 to the known good electrical conductor 152. The metallic voltage measurement $E_{m\_KGEC\_connected}$ and the disturbing voltage measurement $E_{d\_KGEC\_connected}$ are obtained in step 358 with the apparatus 120 electrically connected to the electrical conductor under test 102.

The apparatus 120 is then used to take measurements from the electrical conductor under test 102. Accordingly, with particular reference also to FIG. 3A, in step 360, the relay U1 104 is opened in order to is intentionally electrically disconnect the apparatus 120 from the electrical conductor under test 102 (and from the known good electrical conductor 152). The metallic voltage measurement $E_{m\_ECUT\_disconnected}$ and the disturbing voltage measurement $E_{d\_ECUT\_disconnected}$ are obtained in step 362 with the apparatus 120 electrically disconnected from the electrical conductor under test 102. In step 364, the relay U1 104 is then closed in order to electrically connect the apparatus 120 to the electrical conductor under test 102. The metallic voltage measurement $E_{m\_ECUT\_connected}$ and the disturbing voltage measurement $E_{d\_ECUT\_connected}$ are obtained in step 366 with the apparatus 120 electrically connected to the electrical conductor under test 102.

In step 368, the connectivity of the electrical conductor under test 102 is determined based on the collected measurements $E_{M\_KGEC\_disconnected}$, $E_{D\_KGEC\_disconnected}$, $E_{M\_KGEC\_connected}$, $E_{D\_KGEC\_connected}$, $E_{M\_ECUT\_disconnected}$, $E_{D\_ECUT\_disconnected}$, $E_{M\_ECUT\_connected}$, and $E_{ECUT\_connected}$. Optionally, if it is determined that full connectivity does not exist in step 370, then the location of the fault may be determined in step 372 based on the collected measurements.

Figure 9:
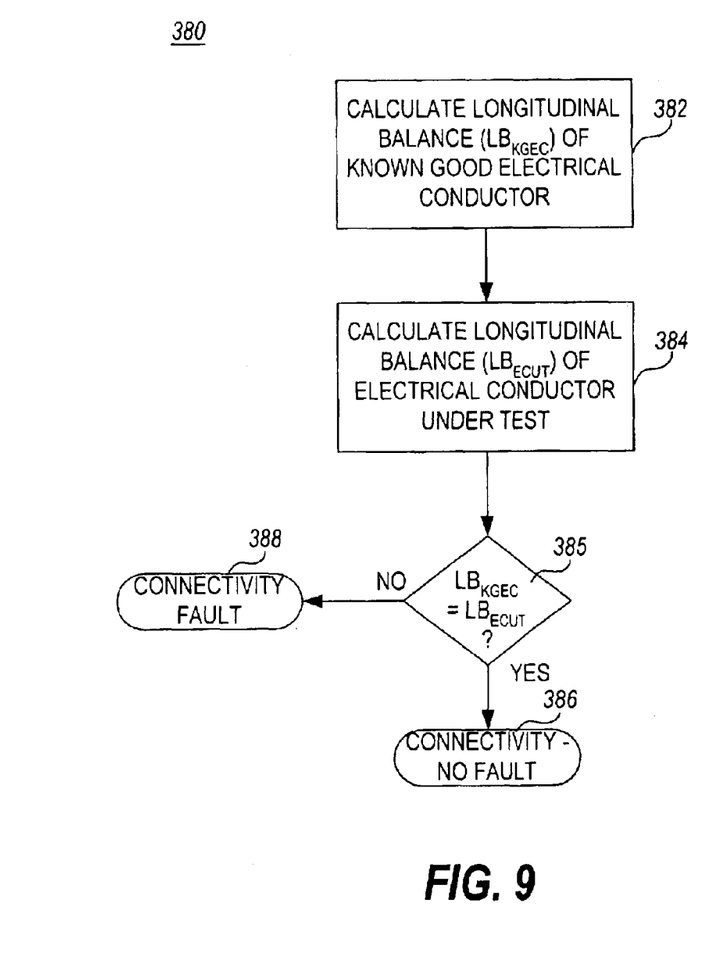
FIG. 9 is an operational flowchart of a method for determining the connectivity of an electrical conductor under test based on measurements collected from the connectivity detection apparatus as described in FIG. 8.

FIG. 9 illustrates a method 380 that may be used to implement step 368 for determining the connectivity of the electrical conductor under test 102. According to method 380, in step 382, the longitudinal balance $LB_{KGEC}$ of the known good connector is calculated according to Equation 1.3:

$$LB_{KGEC} = LB_{KGEC\_connected} - LB_{KGEC\_disconnected}, \quad \text{(Equation 1.3)}$$

where:

$LB_{KGEC\_connected} = 20 * \log_{10}(E_{m\_KGEC\_connected}/E_{d\_KGEC\_connected})$ dB, and $LB_{KGEC\_disconnected} = 20 * \log_{10}(E_{m\_KGEC\_disconnected}/E_{d\_KGEC\_disconnected})$ dB.

In step 384, the longitudinal balance $LB_{ECUT}$ of the known good connector is calculated according to Equation 1.4:

$$LB_{ECUT} = LB_{ECUT\_connected} - LB_{ECUT\_disconnected}, \quad \text{(Equation 1.4)}$$

where:

$LB_{ECUT\_connected} = 20 * \log_{10}(E_{m\_ECUT\_connected}/E_{d\_ECUT\_connected})$ dB, and $LB_{ECUT\_disconnected} = 20 * \log_{10}(E_{m\_ECUT\_disconnected}/E_{d\_ECUT\_disconnected})$ dB.

In step 385, the longitudinal balance $LB_{ECUT}$ calculated for the electrical conductor under test 102 is compared to the longitudinal balance $LB_{KGEC}$ calculated for the known good electrical conductor 152. If the measurements $LB_{ECUT}$ and $LB_{KGEC}$ are substantially equal (subject to error margin thresholds), this indicates in step 386 that the electrical conductor under test 102 has full connectivity with no resistive faults. However, if the measurements $LB_{ECUT}$ and $LB_{KGEC}$ are substantially unequal (subject to error margin thresholds), this indicates in step 388 that a resistive fault (i.e., an open or partial open) exists somewhere along the electrical conductor under test 102.

It will of course be clear in both alternative measuring methods 300 in FIG. 6 and 350 in FIG. 8 that the order of measurements taken does not affect the value of the measurements, and they may therefore be obtained in any convenient order. The order shown, in which the measurements of the known good electrical conductor are obtained prior to the measurements of the electrical conductor under test, is convenient especially if a run of electrical conductors identical by design is to be tested. This order allows the measurements of the known good electrical conductor to be obtained once and saved for use in comparison to the measurements of each electrical conductor under test in the run.

As described earlier, step 322 in FIG. 6 and 372 in FIG. 8 are optional steps for determining the location of the resistive fault. It is known that the capacitance, resistance, and inductance of an electrical conductor under test having a constant cross-sectional area and uniform material composition is proportional to the length of the conductor. Accordingly, the location of the resistive fault along the electrical conductor under test could be calculated according to Equation 1.2 below:

$$x = \text{length} KGEC/(E_{KGEC\_connected}/E_{ECUT\_connected}), \quad \text{(Equation 1.2)}$$

where x is the distance along the electrical conductor under test from the relay U1 104 to the location of the resistive fault.

Figure 10:
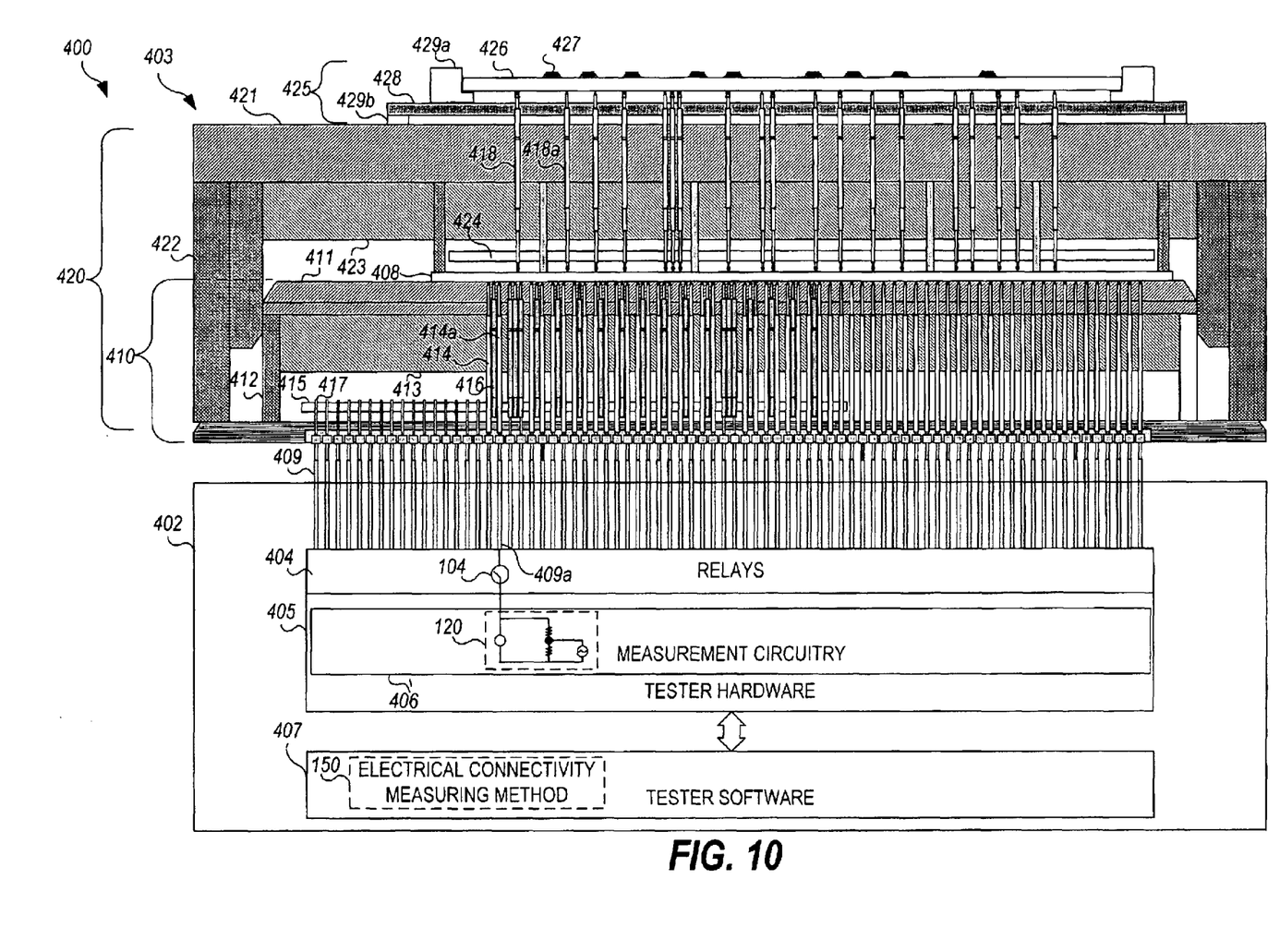
FIG. 10 is a side cross-cut view of an automated tester in which a connectivity detection apparatus implemented in accordance with the invention is employed.

FIG. 10 is a side cross-cut view of an automated test system 400 which implements the connectivity detection apparatus of the invention. The test system 400 includes a tester 402, a fixture 403, and a device under test (DUT) mount 425. Tester 402 includes a plurality of test interface pins 409 arranged in an array along the top side of the tester 402. Tester 402 includes tester hardware 405 which operates automatically or under the control of tester software 407 The tester software 407 may execute within the tester 402 itself (as shown), or remotely via a standard communication interface (not shown). The tester software 407 configures the hardware 405 to make or not make electrical connections between measurement circuits within the tester and each of the test interface pins 409 via relays 404. To this end, each test interface pin 409 is connectable to or isolated from the tester hardware by a relay 404. Electrical contact may be made between a pin of a measurement circuit (e.g., 120) and a respective test interface pin (e.g., 409a) by closing the relay (e.g., 104); conversely, the pin (e.g., 409a) may be isolated from the measurement circuit (e.g., 120) by opening the relay (e.g., 104).

Mounted on top of the tester and over the tester interface pin 409 field is the test fixture 403. The fixture 403 includes a fixture frame 420, which comprises a top plate 421, a guide plate 423 supported by sidewalls 422, and an alignment plate 424. Fixture 403 also includes a plurality of double-ended spring probes 418 that are inserted through precisely aligned holes in the top plate 421, guide/plate 423 and alignment plate 424.

In the illustrative embodiment, the fixture 403 comprises a fixture printed circuit board (PCB) adapter 410. The fixture PCB adapter 410 comprises an adapter top plate 411 and an adapter guide plate 413 which together are supported by sidewalls 412. Adapter 410 includes a plurality of solid floating probes 414 that are inserted through precisely aligned holes in the guide/plate 413 and top plate 411. Guide plate 413 ensures precise vertical alignment of the solid floating probes 414.

In the embodiment shown, the adapter 410 also includes a probe field shrinking printed circuit board (PCB) 415 which is used to translate the relatively larger field of test interface pins 409 of the tester 402 to a relatively smaller probe field of the printed circuit board under test 426. In particular, in this embodiment, the probe field shrinking PCB 415 comprises a plurality of pins 417 that connect on one end to the top tips of certain test interface pins 409 of the tester and on the other end to conductive traces on the probe field shrinking PCB 415 which route to conductive pads on the top side of the probe field shrinking PCB 415. The adapter 410 includes a plurality of single-ended spring probes 416 whose bottom tips electrically contact the conductive pads on the top side of the probe field shrinking PCB 415. The single-ended spring probes 416 are also inserted through precisely aligned holes in the guide/plate 413 and top plate 411.

The fixture PCB adapter 410 is mounted over the test interface pin 409 field such that the bottom tips of the solid floating probes 414 and the bottom tips of the probe field shrinking PCB pins 417 align with and make electrical contact with the top tips of corresponding test interface pins 409 of the tester 402, as shown.

A fixture printed circuit board (PCB) 408 is mounted on the top plate 411 of the adapter 410 such that the top tips of the solid floating probes 414 and the top tips of the single-ended spring probes 416 align with and make electrical contact with conductive pads on the bottom side of the fixture PCB 408. The conductive pads on the bottom side of the fixture PCB 408 electrically connect to conductive pads on the top side of the fixture PCB 408 by traces and vias, and possibly through several intervening conductive layers of the PCB 408.

Fixture frame 420 is mounted over the fixture adapter 410, precisely aligning the bottom tips of the double-ended spring probes 418 onto conductive pads on the top of the fixture PCB 408 to ensure electrical contact.

The DUT mount 425 includes a support plate 428 mounted on the top side of the frame top plate 421 by foam or spring gaskets 429b. Foam or spring gaskets 429a are also mounted on the top side of the support plate 428 to allow a DUT 426 such as a printed circuit board (PCB) under test to be mounted thereon. The DUT 426 may be loaded, including one or more electrical components 427 attached thereto, or may be a bare board.

When the DUT 426 is to be tested, the tester interface pins 409 press on the fixture PCB 408 upward at its bottom conductive pads (indirectly through the fixture adapter 410). Simultaneously, the bottom tips of the double-ended probes 418 press against the fixture PCB 408 downward against its top conductive pads. The top tips of the double-ended probes 418 press against the bottom conductive pads of the DUT 426. During test of the DUT 426, the test software 407 directs the tester hardware 405 to configure connections between certain tester interface pins 409 of interest to measurement circuits within the tester hardware 405. The tester hardware 405 may then make measurements of the device or pad under test according to software instruction.

The measurement circuitry 406 in the tester hardware 404 includes at least one electrical connectivity apparatus 120 (shown in detail in FIGS. 3A and 3B). The node 112 of the apparatus is configurable to be connected (either hardwired or switched) to a relay 104 in the bank of relays 404. The relay is switchably connectable to a tester interface pin 409a under the control of the tester software 407, which implements one of the methods for measuring the electrical connectivity of an electrical conductor under test. The electrical conductor under test may be a trace, a pin of an electrical component, or a connector on the DUT 426. The chosen tester interface pin 409a electrically connects to the electrical conductor under test through the test fixture. To this end, the tester interface pin 409a electrically contacts solid floating probe 414a of the adapter 410. The solid floating probe 414a electrically contacts a conductive pad (not shown) on the bottom side of the fixture PCB 408. This conductive pad electrically connects to a conductive pad (not shown) on the top side of the fixture PCB 408 by way of traces and vias, and possibly through several intervening conductive layers of the PCB 408. The bottom tip of fixture probe 418a electrically contacts the conductive pad of the PCB 408 and the top Up of fixture probe 418a electrically contacts a conductive pad (not shown) on the bottom side of the DUT 426, forming an electrical connection therebetween. By design, the pad on the bottom side of the DUT 426 electrically connects to the electrical conductor under test.

The tester software 407 includes an electrical connectivity measuring method 150 that preferably implements one of the measuring methods 200, 250, or 280 described in FIGS. 4, 5, and 6. The electronic connectivity measuring method 150 interacts, either directly or indirectly through additional tester software, with the tester hardware to configure the tester hardware connections to utilize the electrical connectivity apparatus 120 for obtaining the electrical connectivity measurements described previously in connection with FIGS. 3A, 3B, 4, 5, and 6 to allow the electronic connectivity measuring method 150 to determine whether a resistive fault exists in the electrical conductor under test.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. An electrical connectivity detection apparatus, comprising:
   a measuring device which measures a potential between a measurement node and a reference node;
   a disturbing voltage generator which causes a disturbing voltage to be applied to said measurement node; and
   an electrical connectivity measuring function which: obtains a disconnected measurement measured by said measuring device comprising said potential between said measurement node and said reference node when said measurement node is disconnected from an electrical conductor under test, obtains a connected measurement measured by said measuring device comprising said potential between said measurement node and said reference node when said measurement node is connected to said electrical conductor under test, and determines that electrical connectivity of said electrical conductor under test exists if said disconnected measurement and said connected measurement are substantially unequal.

2. An electrical connectivity detection apparatus in accordance with claim 1, wherein said disturbing voltage generator comprises:
   a first resistance connected between said measurement node and an intermediate node;
   a second resistance connected between said intermediate node and said reference node; and
   a wave generator which applies an alternating current (AC) signal to said intermediate node.

3. An electrical connectivity detection apparatus in accordance with claim 1, wherein:
   said disconnected measurement and said connected measurement are substantially unequal when said connected measurement is outside a margin of error relative said disconnected measurement.

4. An electrical connectivity detection apparatus in accordance with claim 1, wherein said electrical connectivity measuring function:
   calculates a disconnected longitudinal balance measurement based on said disconnected measurement;
   calculates a connected longitudinal balance measurement based on said connected measurement; and
   determines that electrical connectivity of said electrical conductor under test exists if said disconnected longitudinal balance measurement and said connected longitudinal balance measurement are substantially unequal.

5. An electrical connectivity detection apparatus in accordance with claim 4, wherein said disturbing voltage generator comprises:
   a first resistance connected between said measurement node and an intermediate node;
   a second resistance connected between said intermediate node and said reference node; and
   a wave generator which applies an alternating current (AC) signal to said intermediate node.

6. An electrical connectivity detection apparatus in accordance with claim 4, wherein:
   said disconnected longitudinal balance measurement and said connected measurement are substantially unequal when said connected longitudinal balance measurement is outside a margin of error relative said disconnected longitudinal balance measurement.

7. An electrical connectivity detection apparatus in accordance with claim 1, wherein said electrical connectivity measuring function:
   obtains a known good electrical conductor disconnected measurement measured by said measuring device comprising said potential between said measurement node and said reference node when said measurement node is disconnected from a known good electrical conductor;
   obtains a known good electrical conductor connected measurement measured by said measuring device comprising said potential between said measurement node and said reference node when said measurement node is connected to said known good electrical conductor;
   calculates a known good electrical conductor measurement comprising a difference between said known good electrical conductor disconnected measurement and said known good electrical conductor connected measurement;
   calculates an electrical conductor under test measurement comprising a difference between said electrical conductor under test disconnected measurement and said electrical conductor under test connected measurement; and
   determines that electrical connectivity of said electrical conductor under test exists if said known good electrical conductor measurement and said electrical conductor under test measurement are substantially unequal.

8. An electrical connectivity detection apparatus in accordance with claim 7, wherein said disturbing voltage generator comprises:
   a first resistance connected between said measurement node and an intermediate node;
   a second resistance connected between said intermediate node and said reference node; and
   a wave generator which applies an alternating current (AC) signal to said intermediate node.

9. An electrical connectivity detection apparatus in accordance with claim 7, wherein:
   said known good electrical conductor measurement and said electrical conductor under test measurement are substantially unequal when said electrical conductor under test measurement is outside a margin of error relative said known good electrical conductor measurement.

10. An electrical connectivity detection apparatus in accordance with claim 7, wherein said electrical connectivity measuring function:
    determines a location of a resistive fault if electrical connectivity of said electrical conductor under test does not exist.

11. An electrical connectivity detection apparatus in accordance with claim 1, wherein said electrical connectivity measuring function:
    obtains a known good electrical conductor disconnected measurement measured by said measuring device comprising said potential between said measurement node and said reference node when said measurement node is disconnected from a known good electrical conductor;
    obtains a known good electrical conductor connected measurement measured by said measuring device comprising said potential between said measurement node and said reference node when said measurement node is connected to said known good electrical conductor;
    calculates a known good electrical conductor disconnected longitudinal balance measurement based on said Known good electrical conductor disconnected measurement;
    calculates a known good electrical conductor connected longitudinal balance measurement based on said known good electrical conductor connected measurement;
    calculates a known good electrical conductor longitudinal balance measurement comprising a difference between said known good electrical conductor disconnected longitudinal balance measurement and said known good electrical conductor connected longitudinal balance measurement;
    calculates an electrical conductor under test disconnected longitudinal balance measurement based on said electrical conductor under test disconnected measurement;
    calculates an electrical conductor under test connected longitudinal balance measurement based on said electrical conductor under test connected measurement;
    calculates an electrical conductor under test longitudinal balance measurement comprising a difference between said electrical conductor under test disconnected longitudinal balance measurement and said electrical conductor under test connected longitudinal balance measurement; and
    determines that electrical connectivity of said electrical conductor under test exists if said known good electrical conductor longitudinal balance measurement and said electrical conductor under test longitudinal balance measurement are substantially unequal.

12. An electrical connectivity detection apparatus in accordance with claim 11, wherein said disturbing voltage generator comprises:
    a first resistance connected between said measurement node and an intermediate node;
    a second resistance connected between said intermediate node and said reference node; and
    a wave generator which applies an alternating current (AC) signal to said intermediate node.

13. An electrical connectivity detection apparatus in accordance with claim 11, wherein:
    said known good electrical conductor longitudinal balance measurement and said electrical conductor under test measurement are substantially unequal when said electrical conductor under test longitudinal balance measurement is outside a margin of error relative said known good electrical conductor longitudinal balance measurement.

14. An electrical connectivity detection apparatus in accordance with claim 11, wherein said electrical connectivity measuring function:
    determines a location of a resistive fault if electrical connectivity of said electrical conductor under test does not exist.

15. A method for detecting a resistive fault in an electrical conductor, said method comprising:
applying a disturbing voltage to be applied to a measurement node; and
obtaining a disconnected measurement comprising a potential between said measurement node and a reference node when said measurement node is disconnected from an electrical conductor under test;
obtaining a connected measurement comprising said potential between said measurement node and said reference node when said measurement node is connected to said electrical conductor under test; and
determining that electrical connectivity of said electrical conductor under test exists if said disconnected measurement and said connected measurement are substantially unequal.

16. A method in accordance with claim 15, wherein:
said disconnected measurement and said connected measurement are substantially unequal when said connected measurement is outside a margin of error relative said disconnected measurement.

17. A method in accordance with claim 15, wherein said determining step comprises:
calculating a disconnected longitudinal balance measurement based on said disconnected measurement;
calculating a connected longitudinal balance measurement based on said connected measurement; and
determining that electrical connectivity of said electrical conductor under test exists if said disconnected longitudinal balance measurement and said connected longitudinal balance measurement are substantially unequal.

18. A method in accordance with claim 17, wherein:
said disconnected longitudinal balance measurement and said connected measurement are substantially unequal when said connected longitudinal balance measurement is outside a margin of error relative said disconnected longitudinal balance measurement.

19. A method in accordance with claim 15, wherein said determining step comprises:
obtaining a known good electrical conductor disconnected measurement comprising said potential between said measurement node and said reference node when said measurement node is disconnected from a known good electrical conductor;
obtaining a known good electrical conductor connected measurement measured by said measuring device comprising said potential between said measurement node and said reference node when said measurement node is connected to said known good electrical conductor;
calculating a known good electrical conductor measurement comprising a difference between said known good electrical conductor disconnected measurement and said known good electrical conductor connected measurement;
calculating an electrical conductor under test measurement comprising a difference between said electrical conductor under test disconnected measurement end said electrical conductor under test connected measurement; and
determining that electrical connectivity of said electrical conductor under test exists if said known good electrical conductor measurement and said electrical conductor under test measurement are substantially unequal.

20. A method in accordance with claim 19, wherein:
said known good electrical conductor measurement and said electrical conductor under test measurement are substantially unequal when said electrical conductor under test measurement is outside a margin of error relative said known good electrical conductor measurement.

21. A method in accordance with claim 19, further comprising:
determining a location of a resistive fault if electrical connectivity of said electrical conductor under test does not exist.

22. A method in accordance with claim 15, wherein said determining step comprises:
obtaining a known good electrical conductor disconnected measurement measured by said measuring device comprising said potential between said measurement node and said reference node when said measurement node is disconnected from a known good electrical conductor;
obtaining a known good electrical conductor connected measurement measured by said measuring device comprising said potential between said measurement node and said reference node when said measurement node is connected to said known good electrical conductor;
calculating a known good electrical conductor disconnected longitudinal balance measurement based on said known good electrical conductor disconnected measurement;
calculating a known good electrical conductor connected longitudinal balance measurement based on said known good electrical conductor connected measurement;
calculating a known good electrical conductor longitudinal balance measurement comprising a difference between said known good electrical conductor disconnected longitudinal balance measurement and said known good electrical conductor connected longitudinal balance measurement;
calculating an electrical conductor under test disconnected longitudinal balance measurement based on said electrical conductor under test disconnected measurement;
calculating an electrical conductor under test connected longitudinal balance measurement based on said electrical conductor under test connected measurement;
calculating an electrical conductor under test longitudinal balance measurement comprising a difference between said electrical conductor under test disconnected longitudinal balance measurement and said electrical conductor under test connected longitudinal balance measurement; and
determining that electrical connectivity of said electrical conductor under test exists if said known good electrical conductor longitudinal balance measurement and said electrical conductor under test longitudinal balance measurement are substantially unequal.

23. A method in accordance with claim 22, wherein:
said known good electrical conductor longitudinal balance measurement and said electrical conductor under test measurement are substantially unequal when said electrical conductor under test longitudinal balance measurement is outside a margin of error relative said known good electrical conductor longitudinal balance measurement.

24. A method in accordance with claim 22, further comprising:
determining a location of a resistive fault if electrical connectivity of said electrical conductor under test does not exist.

* * * * *